United States Patent
Xu et al.

(10) Patent No.: US 10,377,861 B2
(45) Date of Patent: Aug. 13, 2019

(54) POLYETHERIMIDE COMPOSITIONS, ARTICLES MADE THEREFROM, AND METHOD OF MANUFACTURE THEREOF

(71) Applicant: SABIC Global Technologies B.V., Bergen op Zoom (NL)

(72) Inventors: Chen Xu, Exton, PA (US); Hao Zhou, Newburgh, IN (US); Wei Zhao, Evansville, IN (US)

(73) Assignee: SABIC GLOBAL TECHNOLOGIES B.V., Bergen op Zoom (NL)

( * ) Notice: Subject to any disclaimer, the term of this patent is extended or adjusted under 35 U.S.C. 154(b) by 0 days.

(21) Appl. No.: 15/538,827

(22) PCT Filed: Dec. 22, 2015

(86) PCT No.: PCT/US2015/067425
§ 371 (c)(1),
(2) Date: Jun. 22, 2017

(87) PCT Pub. No.: WO2016/109351
PCT Pub. Date: Jul. 7, 2016

(65) Prior Publication Data
US 2017/0362386 A1    Dec. 21, 2017

Related U.S. Application Data

(60) Provisional application No. 62/098,476, filed on Dec. 31, 2014.

(51) Int. Cl.

| | | |
|---|---|---|
| C08L 79/08 | (2006.01) |
| C08G 73/10 | (2006.01) |
| C08K 3/04 | (2006.01) |
| C08K 3/28 | (2006.01) |
| C09D 179/08 | (2006.01) |
| H05K 1/03 | (2006.01) |
| C08L 71/00 | (2006.01) |
| C08L 81/06 | (2006.01) |
| C08K 3/38 | (2006.01) |

(52) U.S. Cl.
CPC ..... *C08G 73/1071* (2013.01); *C08G 73/1064* (2013.01); *C08K 3/04* (2013.01); *C08K 3/28* (2013.01); *C08L 71/00* (2013.01); *C08L 79/08* (2013.01); *C08L 81/06* (2013.01); *C09D 179/08* (2013.01); *H05K 1/0373* (2013.01); *C08K 2003/385* (2013.01); *H05K 2201/0154* (2013.01); *H05K 2201/0209* (2013.01)

(58) Field of Classification Search
CPC ............... C08J 2481/06; H01G 4/32; B29C 2947/92238; H05K 2201/0154; H05K 1/0393; C08L 79/08; C08G 73/1046
See application file for complete search history.

(56) References Cited

U.S. PATENT DOCUMENTS

| | | | | |
|---|---|---|---|---|
| 4,629,745 A | * | 12/1986 | Hoki | ................. C08J 9/142 521/154 |
| 4,816,526 A | | 3/1989 | Bristowe et al. | |
| 6,433,317 B1 | * | 8/2002 | Arx | .................. A47G 19/2288 219/468.1 |
| 2003/0181560 A1 | * | 9/2003 | Kawaguchi | ............. B32B 15/08 524/424 |
| 2006/0194070 A1 | | 8/2006 | Croll et al. | |
| 2008/0153959 A1 | | 6/2008 | Charati et al. | |
| 2010/0159224 A1 | | 6/2010 | Donovan et al. | |
| 2010/0283001 A1 | | 11/2010 | Pot et al. | |
| 2012/0156459 A1 | | 6/2012 | Lu et al. | |
| 2012/0287555 A1 | * | 11/2012 | Silvi | ................. C08J 5/18 361/301.5 |
| 2014/0020933 A1 | | 1/2014 | Hedin et al. | |

FOREIGN PATENT DOCUMENTS

| | | |
|---|---|---|
| CA | 2026452 A1 | 4/1991 |
| JP | 2002161244 | 6/2002 |
| WO | 2008116939 A2 | 10/2008 |

OTHER PUBLICATIONS

International Search Report for International Application No. PCT/US2015/067425; International Filing Date: Dec. 22, 2015; dated Apr. 13, 2016; 6 pages.

Written Opinion of the International Searching Authority for International Application No. PCT/US2015/067425; International Filing Dae: Dec. 22, 2015; dated Apr. 13, 2016; 8 pages.

* cited by examiner

*Primary Examiner* — Gregory Listvoyb
(74) *Attorney, Agent, or Firm* — Cantor Colburn LLP

(57) ABSTRACT

A polyetherimide composition is disclosed including a polyetherimide sulfone having a glass transition temperature of 240 to 320 C, preferably 245 to 312 C, and a particulate, thermally conductive filler composition. A layer of the polyetherimide composition resists deformation as determined by IPC method TM-650 when subjected to a lead-free solder reflow process at a temperature of greater than or equal to 260 C, preferably 260 to 350 C. A layer including the polyetherimide composition further has a thermal conductivity of 2.5 to 15 W/mK, preferably 3 to 12 W/mK, as determined in accordance with ISO 22007-2:2008.

5 Claims, No Drawings

POLYETHERIMIDE COMPOSITIONS, ARTICLES MADE THEREFROM, AND METHOD OF MANUFACTURE THEREOF

CROSS-REFERENCE TO RELATED APPLICATIONS

This application is a National Stage application of PCT/US2015/067425, filed Dec. 22, 2015, which claims the benefit of U.S. Provisional Application No. 62/098,476, filed Dec. 31, 2014, both of which are incorporated by reference herein in their entirety.

BACKGROUND

Polyimides, in particular polyetherimides (PEI), are amorphous, transparent, high performance polymers having a glass transition temperature (Tg) of greater than 180° C. Polyetherimides further have high strength, toughness, heat resistance, and modulus, and broad chemical resistance, and so are widely used in industries as diverse as automotive, telecommunication, aerospace, electrical/electronics, transportation, and healthcare.

Dielectric materials for use in circuit materials and circuit boards have been the subject of intensive research and development. Nonetheless there remains a continuing need in the art for improved dielectric compositions. In many electronic applications, the electronic components frequently generate heat, and it is desirable that the circuit board contribute to heat dissipation. Such materials should further have improved heat conductivity and be tolerant of high processing temperatures, soldering temperatures, and operating temperatures, since a thermal gradient will usually exist between the warmer interior of the equipment and the ambient surroundings. Preferred materials would thus possess high heat resistance, excellent dimensional and thermal stability, and chemical resistance. Preferred materials should further exhibit excellent electrical properties, including a high use temperature, high processing/soldering temperature, a low dielectric constant, good flexibility, and adhesion to metal surfaces. It would be a further processing advantage if the dielectric compositions could be directly cast on the metal layer by solvent casting, or extruded into films using solvent-free processes such as melt extrusion. Preferred dielectric compositions can further comprise thermally conductive or electrically conductive fillers, and the dielectric layer should be relatively thin (<100 micrometers) for good heat conductivity.

BRIEF DESCRIPTION

A polyetherimide composition comprises a polyetherimide sulfone having a glass transition temperature of 240 to 320° C., preferably 245 to 312° C.; and a particulate, thermally conductive filler composition, wherein a layer comprising the polyetherimide composition resists deformation as determined by IPC method TM-650 when subjected to a lead-free solder reflow process at a temperature of greater than or equal to 260° C., preferably 260 to 350° C.; and a layer comprising the polyetherimide composition has a thermal conductivity of 2.5 to 15 W/mK, preferably 3 to 12 W/mK, as determined in accordance with ISO 22007-2:2008.

In another embodiment, a polyetherimide composition comprises a polyetherimide sulfone having a glass transition temperature of 240 to 320° C., preferably 245 to 312° C.; an additional polymer different from the polyetherimide sulfone having a glass transition temperature greater than 140° C.; and a particulate, thermally conductive filler composition wherein a layer comprising the polyetherimide composition resists deformation as determined by IPC method TM-650 when subjected to a lead-free solder reflow process at a temperature of greater than or equal to 260° C., preferably 260 to 350° C.; and a layer comprising the polyetherimide composition has a thermal conductivity of 3 to 6 W/mK, preferably 3 to 5.5 W/mK, as determined in accordance with ISO 22007-2:2008.

A circuit assembly comprises a polyetherimide dielectric layer comprising the polyetherimide composition and a conductive metal layer disposed on the polyetherimide dielectric layer; wherein the polyetherimide dielectric layer resists deformation as determined by IPC method TM-650 when subjected to a lead-free solder reflow process at a temperature of greater than or equal to 260° C., preferably 260 to 350° C., and the polyetherimide dielectric layer has a thermal conductivity of 2.5 to 15 W/mK, preferably 3 to 12 W/mK, as determined in accordance with ISO 22007-2:2008.

An article comprising the circuit assembly is also disclosed.

A method of preparing the circuit assembly comprises extruding the polyetherimide dielectric layer, laminating the polyetherimide dielectric layer to the conductive metal layer under heat and pressure, and reflow-soldering an electronic component to the circuit assembly.

The above described and other features are exemplified by the following Detailed Description, Examples, and Claims.

DETAILED DESCRIPTION

Described herein are polyetherimide compositions comprising a polyetherimide sulfone having a glass transition temperature of 240 to 320° C., preferably 245 to 312° C., and a particulate, thermally conductive filler composition. The polyetherimide compositions can be useful for circuit assemblies comprising a conductive metal layer for circuit printing, and a polyetherimide dielectric layer on the conductive metal layer, the polyetherimide dielectric layer comprising the polyetherimide composition. The circuit assemblies can further comprise additional metal layer and dielectric layer combinations for complex circuit designs. The inventors hereof have discovered that the use of polyetherimide sulfone in the dielectric layer provides assemblies that maintain excellent adhesion and dimensional stability even after thermal stress at temperatures greater than the glass transition temperature, e.g. at temperatures of greater than 280° C. The circuit assemblies are particularly useful for the preparation of thermally conductive circuit assemblies. The dielectric layers can further have good heat conductivity and electrical insulation, as well as exceptional processability, especially when compared to polyimide and epoxy-based dielectric layers.

The polyetherimide composition comprises a polyetherimide sulfone and optional additives as further described below. The polyetherimides have a glass transition temperature (Tg) of 240° C. or more, e.g., 240 to 320° C., specifically 245 to 312° C., or 245 to 300° C.

The polyetherimide sulfones comprise more than 1, for example 10 to 1000, or 10 to 500, structural units of formula (1)

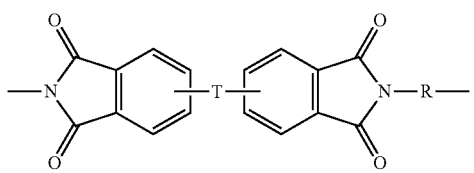

(1)

wherein each R is the same or different, and is a substituted or unsubstituted divalent organic group, such as a $C_{6-20}$ aromatic hydrocarbon group or a halogenated derivative thereof, a straight or branched chain $C_{2-20}$ alkylene group or a halogenated derivative thereof, a $C_{3-8}$ cycloalkylene group or halogenated derivative thereof, in particular a divalent group of formula (2)

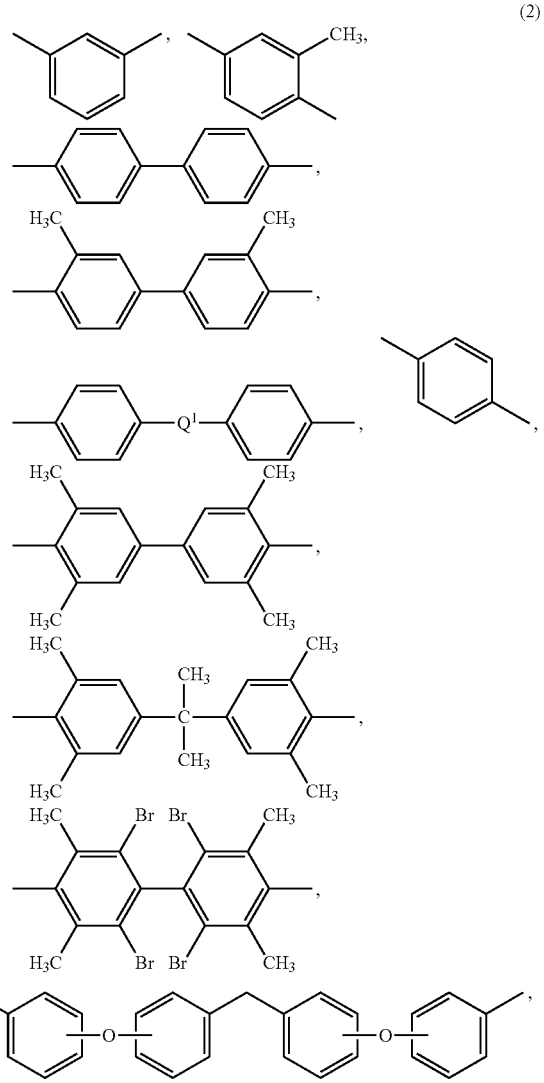

(2)

wherein $Q^1$ is —O—, —S—, —C(O)—, —SO$_2$—, —SO—, —C$_y$H$_{2y}$— wherein y is an integer from 1 to 5 or a halogenated derivative thereof (which includes perfluoroalkylene groups), or —(C$_6$H$_{10}$)$_z$— wherein z is an integer from 1 to 4, provided that at least 10 mol % of the R groups comprise a sulfone group. In an embodiment at least 10 mole % of the R groups are diphenylene sulfone groups, with the remainder of the R groups being is m-phenylene or p-phenylene.

Further in formula (1), T is —O— or a group of the formula —O—Z—O— wherein the divalent bonds of the —O— or the —O—Z—O— group are in the 3,3', 3,4', 4,3', or the 4,4' positions. The group Z in —O—Z—O— of formula (1) is also a substituted or unsubstituted divalent organic group, and can be an aromatic $C_{6-24}$ monocyclic or polycyclic moiety optionally substituted with 1 to 6 $C_{1-8}$ alkyl groups, 1 to 8 halogen atoms, or a combination thereof, provided that the valence of Z is not exceeded. Exemplary groups Z include groups derived from a dihydroxy compound of formula (3)

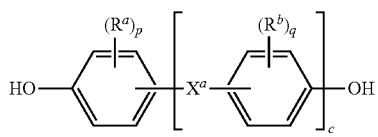

(3)

wherein $R^a$ and $R^b$ can be the same or different and are a halogen atom or a monovalent $C_{1-6}$ alkyl group, for example; p and q are each independently integers of 0 to 4; c is 0 to 4; and $X^a$ is a bridging group connecting the hydroxy-substituted aromatic groups, where the bridging group and the hydroxy substituent of each $C_6$ arylene group are disposed ortho, meta, or para (specifically para) to each other on the $C_6$ arylene group. The bridging group $X^a$ can be a single bond, —O—, —S—, —S(O)—, —SO$_2$—, —C(O)—, or a $C_{1-18}$ organic bridging group. The $C_{1-18}$ organic bridging group can be cyclic or acyclic, aromatic or non-aromatic, and can further comprise heteroatoms such as halogens, oxygen, nitrogen, sulfur, silicon, or phosphorous. The $C_{1-18}$ organic group can be disposed such that the $C_6$ arylene groups connected thereto are each connected to a common alkylidene carbon or to different carbons of the $C_{1-18}$ organic bridging group. A specific example of a group Z is a divalent group of formula (3a)

(3a)

wherein Q is —O—, —S—, —C(O)—, —SO$_2$—, —SO—, or —C$_y$H$_{2y}$— wherein y is an integer from 1 to 5 or a halogenated derivative thereof (including a perfluoroalkylene group). In a specific embodiment Z is a derived from bisphenol A, such that Q in formula (3a) is 2,2-isopropylidene.

The polyetherimide optionally comprises up to 10 mole %, up to 5 mole %, or up to 2 mole % of units of formula (1) wherein T is a linker of the formula

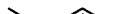

In some embodiments no units are present wherein R is of these formulas.

In an embodiment in formula (1), R is diphenylene sulfone and m-phenylene or p-phenylene and T is —O—Z—O— wherein Z is a divalent group of formula (3a). Alternatively, R is diphenylene sulfone and m-phenylene or p-phenylene and T is —O—Z—O— wherein Z is a divalent group of formula (3a) and Q is 2,2-isopropylidene.

The polyetherimide can be prepared by any of the methods well known to those skilled in the art, including the reaction of an aromatic bis(ether anhydride) of formula (5)

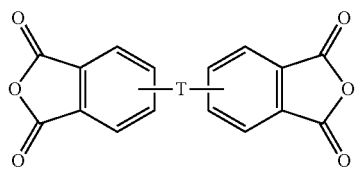

(5)

with an organic diamine of formula (6)

(6)

wherein T and R are defined as described above.

Illustrative examples of bis(anhydride)s include 3,3-bis[4-(3,4-dicarboxyphenoxy)phenyl]propane dianhydride; 4,4'-bis(3,4-dicarboxyphenoxy)diphenyl ether dianhydride; 4,4'-bis(3,4-dicarboxyphenoxy)diphenyl sulfide dianhydride; 4,4'-bis(3,4-dicarboxyphenoxy)benzophenone dianhydride; 4,4'-bis(3,4-dicarboxyphenoxy)diphenyl sulfone dianhydride; 2,2-bis[4-(2,3-dicarboxyphenoxy)phenyl]propane dianhydride; 4,4'-bis(2,3-dicarboxyphenoxy)diphenyl ether dianhydride; 4,4'-bis(2,3-dicarboxyphenoxy)diphenyl sulfide dianhydride; 4,4'-bis(2,3-dicarboxyphenoxy)benzophenone dianhydride; 4,4'-bis(2,3-dicarboxyphenoxy)diphenyl sulfone dianhydride; 4-(2,3-dicarboxyphenoxy)-4'-(3,4-dicarboxyphenoxy)diphenyl-2,2-propane dianhydride; 4-(2,3-dicarboxyphenoxy)-4'-(3,4-dicarboxyphenoxy)diphenyl ether dianhydride; 4-(2,3-dicarboxyphenoxy)-4'-(3,4-dicarboxyphenoxy)diphenyl sulfide dianhydride; 4-(2,3-dicarboxyphenoxy)-4'-(3,4-dicarboxyphenoxy)benzophenone dianhydride; and, 4-(2,3-dicarboxyphenoxy)-4'-(3,4-dicarboxyphenoxy)diphenyl sulfone dianhydride, as well as various combinations thereof.

Examples of organic diamines include ethylenediamine, propylenediamine, trimethylenediamine, diethylenetriamine, triethylene tetramine, hexamethylenediamine, heptamethylenediamine, octamethylenediamine, nonamethylenediamine, decamethylenediamine, 1,12-dodecanediamine, 1,18-octadecanediamine, 3-methylheptamethylenediamine, 4,4-dimethylheptamethylenediamine, 4-methylnonamethylenediamine, 5-methylnonamethylenediamine, 2,5-dimethylhexamethylenediamine, 2,5-dimethylheptamethylenediamine, 2,2-dimethylpropylenediamine, N-methyl-bis (3-aminopropyl) amine, 3-methoxyhexamethylenediamine, 1,2-bis(3-aminopropoxy) ethane, bis(3-aminopropyl) sulfide, 1,4-cyclohexanediamine, bis-(4-aminocyclohexyl) methane, m-phenylenediamine, p-phenylenediamine, 2,4-diaminotoluene, 2,6-diaminotoluene, m-xylylenediamine, p-xylylenediamine, 2-methyl-4,6-diethyl-1,3-phenylene-diamine, 5-methyl-4,6-diethyl-1,3-phenylene-diamine, benzidine, 3,3'-dimethylbenzidine, 3,3'-dimethoxybenzidine, 1,5-diaminonaphthalene, bis(4-aminophenyl) methane, bis(2-chloro-4-amino-3,5-diethylphenyl) methane, bis (4-aminophenyl) propane, 2,4-bis(p-amino-t-butyl) toluene, bis(p-amino-t-butylphenyl) ether, bis(p-methyl-o-aminophenyl) benzene, bis(p-methyl-o-aminopentyl) benzene, 1, 3-diamino-4-isopropylbenzene, bis(4-aminophenyl) sulfide, bis-(4-aminophenyl) sulfone, and bis(4-aminophenyl) ether. Combinations of these compounds can also be used. In some embodiments the organic diamine is m-phenylenediamine, p-phenylenediamine, sulfonyl dianiline, or a combination comprising one or more of the foregoing.

The polyetherimides can have a melt index of 0.1 to 10 grams per minute (g/min), as measured by American Society for Testing Materials (ASTM) D1238 at 340 to 370° C., using a 6.7 kilogram (kg) weight. In some embodiments, the polyetherimide has a weight average molecular weight (Mw) of 1,000 to 150,000 grams/mole (Daltons), as measured by gel permeation chromatography, using polystyrene standards. In some embodiments the polyetherimide has an Mw of 10,000 to 80,000 Daltons. Such polyetherimides can have an intrinsic viscosity greater than 0.2 deciliters per gram (dl/g), or, more specifically, 0.35 to 0.7 dl/g as measured in m-cresol at 25° C.

The polyetherimide sulfone can be present in an amount of 30 to 90 weight percent (wt. %), specifically 30 to 70 wt. %, or 40 to 70 wt. %, based on the total weight of the polyetherimide composition.

The polyetherimide composition further comprises a thermally conductive filler composition. Thermally conductive filler components are selected primarily to provide the material with good thermal conductivity. Useful thermally conductive fillers include aluminum nitride (AlN), aluminum carbide (AlC), boron nitride (BN), aluminum oxynitride (AlON), magnesium silicon nitride (MgSiN$_2$), silicon carbide (SiC), silicon nitride (Si$_3$N$_4$), graphite, expanded graphite, graphene, carbon fiber, zinc sulfide (ZnS), calcium oxide (CaO), magnesium oxide (MgO), titanium oxide, carbon nanotubes, or a combination comprising at least one of the foregoing. Particles, e.g., of graphite or aluminum oxide coated with any of the foregoing can also be used. Boron nitride, aluminum nitride, aluminum oxide, graphite, and combinations comprising at least one of the foregoing are especially useful. For example, the thermally conductive filler composition can comprise boron nitride, graphite, or a combination comprising at least one of the foregoing.

The thermally conductive filler can have an average particle size of 50 nanometers to 50 micrometers, and can be of any shape and of any aspect ratio. The dielectric compositions containing the polyetherimide and the thermally conductive filler component can be mixed enough so that the average particle size of the thermally conductive filler particle is adequately reduced and a stable dispersion is formed. The thermally conductive filler component can be uniformly dispersed so that the average particle size of the filler in an organic solvent compatible with the polymer component (or the polymer component) is greater than 10, 20, 30, 40, or 50 nanometers to less than 1.0, 2.0, 3.0, 5.0, 10, or 20 micrometers. Generally speaking, filler component that is not adequately dispersed (e.g. a filler component that contains large agglomerates) can oftentimes degrade or defeat the functional aspects sought after in the materials.

The amount of thermally conductive filler composition present in the composition is 1 to 70 weight percent, or 10 to 60 weight percent, specifically 30 to 60 weight percent, each based on the total weight of the polyetherimide composition. In an embodiment, the thermally conductive filler composition can comprise 30 to 60 wt. %, or 30 to 50 wt. % boron nitride. In another embodiment, the thermally conductive filler composition comprises 30 to 60 wt. %, or 30 to 50 wt. % boron nitride and 1 to 20 wt. %, or 1 to 15 wt. %, or 5 to 15 wt. % graphite.

Other fillers can be present in the dielectric layer, particularly dielectric thermally insulating fillers such as talc ($H_2Mg_3(SiO_3)_4$), calcium carbonate ($CaCO_3$), magnesium hydroxide ($Mg(OH)_2$, aluminum oxide ($Al_2O_3$), zinc oxide (ZnO), titanium dioxide ($TiO_2$), mica, barium oxide (BaO), boehmite (AlO(OH)), gibbsite ($Al(OH)_3$), barium sulfate ($BaSO_4$), wollastonite ($CaSiO3$), zirconium oxide ($ZrO_2$), silica ($SiO_2$), glass beads, glass fibers, magnesium aluminate ($MgO.xAl_2O_3$), dolomite ($CaMg(CO_3)_2$), ceramic-coated graphite, clay, and a combination comprising at least one of the foregoing. Any of the above-mentioned thermally conductive fillers coated with any one or more of the thermally insulating fillers can also be used, for example graphite coated with TiO, ZnO, or any of the foregoing. The amount of dielectric filler component in the polymer matrix, when present, is 1 to 60 weight percent, or 10 to 50 weight percent, specifically 20 to 40 weight percent, each based on the total weight of the polyetherimide composition.

The polyetherimide composition can further comprise other additives as is known in the art, for example antioxidants, thermal stabilizers, flame retardants, and the like. In an embodiment, the polyetherimide composition can optionally comprise an additional polymer different from the polyetherimide sulfone, in an amount, for example, of 1 to 35 wt. %, or 5 to 30 wt. %, or 10 to 20 wt. %, based on the total weight of the composition. Preferably the additional polymer is a high temperature thermoplastic polymer having a glass transition temperature of 180° C. or higher, preferably 200° C. or higher, more preferably 220° C., or higher, or most preferably 250° C. or higher. There is no particular upper limit, although 400° C. may be mentioned. The polymers are further hydrolytically stable at high temperatures, for example 180° C. or higher, preferably 200° C. or higher, more preferably 220° C., or higher, or most preferably 250° C. or higher.

Thermoplastic polymers that meet these conditions generally contain aromatic groups, for example polyphthalamides (PPA), aromatic polyimides, aromatic polyetherimides (PEI), polyphenylene sulfides (PPS), polyaryletherketones (PAEK), polyetherether ketones (PEEK), polyetherketoneketones (PEKK), polyethersulfones (PES), polyphenylenesulfones (PPSU), polyphenylenesulfone ureas, self-reinforced polyphenylene (SRP), or the like. A combination comprising at least one of the foregoing can be used. The thermoplastic polymers can be linear or branched and include homopolymers or copolymers comprising units of two or more of the foregoing thermoplastic polymers, for example polyamide-imides (PAI). The copolymers can be random, alternating, graft, and block copolymers having two or more blocks of different homopolymers, random, or alternating copolymers. Specific high temperature polymers are the aromatic polyetherimides available from SABIC under the trade name ULTEM. The high temperature thermoplastic polymers can be obtained and used in either pellet or powder form The thermoplastic polymers can have a weight average molecular weight (Mw) of about 1,000 to about 200,000 g/mol, preferably about 1,000 to about 1,000 g/mol. The thermoplastic polymers can have a melt flow of 1 g/10 minutes or higher, preferably 10 g/10 minutes or higher, up to 7,500 g/10 minutes, each determined according to ASTM D 1283 at 316° C. under a 5 kg load, and in another embodiment greater than about 50 g/10 minutes.

Circuit assemblies for the manufacture of printed circuit boards (PCBs) also known as printed wiring boards (PWBs), including metal core PCBs (MCPCBs) and multilayer circuits, are well known in the art. In general, circuit assemblies comprise a dielectric layer, an electrically conductive metal layer such as copper, and a supporting metal matrix layer such as aluminum for heat dissipation, where the dielectric layer is disposed between the conductive metal layer and the supporting metal matrix layer. The conductive metal layer can be laminated, adhered, sputtered, or plated onto the dielectric layer. The dielectric layer generally includes a polymer, such as a cross-linked epoxy, or a polyimide. The dielectric layer can further contain fibrous reinforcement, such as a woven or nonwoven glass, and inorganic fillers. The circuit assemblies can then be subjected to a series of steps to leave a circuitized metal pattern on the dielectric layer. The circuitized pattern serves to connect the various electronic components that can be added to make the desired electronic device. Such circuitized layers can be used alone or in a multilayer stack having interlayer connections.

Circuit assemblies can include the polyetherimide composition in a dielectric layer. The dielectric layer can be adhered to a conductive metal layer, in particular, a foil. The metal can be adhered to one or both sides of the dielectric layer. Conductive metals include copper, zinc, brass, chrome, nickel, aluminum, stainless steel, iron, gold, silver, titanium, or an alloy containing one or more of these metals. Other useful metals include, but are not limited to, a copper molybdenum alloy, a nickel-cobalt iron alloy such as Kovar®, available from Carpenter Technology Corporation, a nickel-iron alloy such as Invar®, available from National Electronic Alloys, Inc., a bimetal, a trimetal, a tri-metal derived from two-layers of copper and one layer of Invar®, and a trimetal derived from two layers of copper and one layer of molybdenum. In some embodiments suitable metal layers comprise copper or a copper-based alloy. Alternatively, wrought copper foils can be used.

Conductive metal layers in exemplary embodiments can have a thickness of 2 to 200 micrometers, specifically 5 to 50 micrometers, and more specifically 5 to 40 micrometers. In some embodiments, the conductive metal layer is in the form of a circuit.

The circuit assemblies can further optionally comprise a heat dissipating metal matrix layer disposed on the dielectric layer on a side opposite the conductive metal layer. Such heat dissipation layers can be metals, in particular thermally conductive metals such as aluminum, boron nitride, aluminum nitride, copper or the like. A thermally conductive, electrically conductive metal can be used provided that the metal is electrically isolated from the metal circuit layer. Preferred supporting metal matrix layers can have a thickness of 0.1 to 20 millimeters, specifically 0.5 to 10 millimeters, and more specifically 0.8 to 2 millimeters.

The circuit assemblies having sandwich-type structure provide good heat dissipation and electric isolation from the printed circuit in the conductive metal layer.

Both the conductive metal layer and the supporting metal matrix layers can be pretreated to have high surface roughness for enhanced adhesion to the dielectric layer. In some cases, the dielectric layer can adhere firmly to the conductive metal layer or the heat dissipation layer without using an adhesive. In other embodiments, an adhesive can be used to improve adhesion of the dielectric layer to the conductive metal layer or the heat dissipation layer. Common adhesives used to bond the composite sheet to a metal (if an adhesive is used) are polyimide-based adhesives, acrylic-based adhesives, or epoxies.

A circuit assembly including a dielectric layer comprising the polyetherimide composition can optionally comprise a fabric layer. Suitable fabrics can comprise non-woven fabrics or woven fabrics comprising any of the following glass types: E, D, S, R, or a combination comprising at least one of the foregoing. Also suitable is NE type glass available from NittoBoseki Co., Fukushima, Japan. Suitable glass styles include, but are not limited to, 106, 1080, 2112, 2113, 2116, and 7628, wherein the term glass style is known to those skilled in the art and refers to the size of glass fibers and number of fibers in a bundle. In other embodiments fabrics can comprise such materials as aramid such as KEVLAR® aramid available from DuPont, aramid/glass hybrid, or ceramic. In addition, woven fabrics of cellulose fibers can also be used. Fabrics can have a thickness from 5 to 200 micrometers, specifically 10 to 50 micrometers, and more specifically 10 to 40 micrometers. In some embodiments fabric, such as the woven or nonwoven glass fabric can optionally be pretreated before use in assembly of the subassemblies. Illustrative treatment methods for fabrics comprise one or both of chemical treatment such as with a sizing agent or a silane, or physical treatment such as by heat, flame, plasma, or corona treatment.

General techniques for preparing the polyetherimide composition and a dielectric layer comprising the polyetherimide composition are known to those skilled in the art. The polyetherimide component can be first dissolved in a suitable solvent, to prepare a solution. A number of solvents can be used, depending on various factors, e. g., their boiling point; and the manner in which the polyetherimide is going to be incorporated into a dielectric layer. Non-limiting examples of the solvents are as follows: methylene chloride, chloroform, ortho-dichlorobenzene (ODCB); N,N-dimethylformamide (DMF); N-methyl-2-pyrrolidone (NMP); veratrole (1,2-dimethoxybenzene); nitromethane, and various combinations of these solvents. The solution containing the polymer can be combined with any optional fillers, and coated onto a substrate to form a dielectric polymer film. Examples of coating processes include, but are not limited to, tape-casting, dip coating, spin coating, chemical vapor deposition, and physical vapor deposition, such as sputtering. In some embodiments, the film can be applied by a solvent casting process. When the film thickness is substantially small, solution based coating techniques such as spin coating or dip coating can be used.

When a fabric is present, the solution containing the polymer and any optional fillers can be impregnated into the fabric by dipping or coating. Alternatively, the dielectric composition without solvent can be melted, combined with any optional fillers, and impregnated into the fabric to provide the dielectric layer. In still another embodiment a layer comprising the polyetherimide and any optional fillers are thermally laminated under heat and pressure to form the dielectric layer. When lamination is used, a first and second layer comprising the polyetherimide and any optional fillers can be disposed on opposite sides of the fabric and laminated. Conditions for lamination can vary depending on the particular polyetherimide, optional filler, and like considerations, and can be for example, 280 to 350° C. under no less than 1 megapascal (MPa) of pressure for 5 to 180 minutes.

Circuit assemblies can be made by thermal lamination of one or more dielectric layers, one or more conductive metal layers, and a supporting metal matrix layer, under pressure without using thermosetting adhesives. The dielectric layer can be prepared prior to the thermal lamination step by a solvent-free process such as melt extrusion, or by a solvent casting process. In some embodiments, the polyetherimide dielectric layer, the conductive metal layer, and the thermal dissipation layer are thermally laminated together by an adhesive-free process under pressure to form a laminate. In an embodiment, a polyetherimide layer is placed between the electrically conductive metal layer and a layer of woven fabric, and thermally laminated under pressure in a single step. The electrically conductive metal layer can optionally be in the form of a circuit before laminating. Alternatively, the conductive metal layer can optionally be etched to form the electrical circuit following lamination. The laminating can be by hot press or roll calendaring methods, i.e., a roll-to-roll method.

Alternatively, the circuit assemblies can be made by a solution casting method in which the polyetherimide is dissolved in a solvent and cast directly onto the electrically conductive metal layer, followed by lamination to the heat dissipating metal matrix layer. The polyetherimide solution can alternatively be cast directly onto the heat dissipating metal matrix layer, followed by lamination to the electrically conductive metal layer. In this embodiment the polyetherimide layer can be referred to as a "varnish."

Multilayer assemblies comprising additional layers can also be made by thermal lamination in one step or in two or more consecutive steps by such processes as hot press or roll calendaring methods. In some embodiments seven layers or fewer can be present in the laminate and in other embodiments sixteen layers or fewer. In an exemplary embodiment a laminate can be formed in one step or in two or more consecutive steps with sequential layers of fabric-polyetherimide-metal-polyetherimide-fabric-polyetherimide-metal foil or a sub-combination thereof with fewer layers, such that the laminate comprises a layer of polyetherimide film between any layer of metal foil and any layer of fabric. In another embodiment a first laminate can be formed in one step or in two or more consecutive steps with a layer of fabric between two layers of polyetherimide, such as a layer of woven glass fabric between two layers of polyetherimide. A second laminate can then be prepared by laminating a metal foil to a polyetherimide side of the first laminate.

The circuit assemblies can have an overall thickness of 0.1 to 20 millimeters and specifically 0.5 to 10 millimeters, wherein overall thickness refers to an assembly comprising a layer each of the polyetherimide dielectric layer, the electrically conductive metal layer, and the supporting metal matrix layer. Circuit assemblies in some particular embodiments have an overall thickness of 0.5 to 2 millimeters and specifically 0.5 to 1.5 millimeters. There is no particular limitation on the thickness of the polyetherimide dielectric layer as long as a desired overall thickness of the laminate is achieved. In some embodiments the thickness of the polyetherimide dielectric layer is 5 to 750 micrometers, specifically 10 to 150 micrometers, and more specifically 10 to 100 micrometers.

The polyetherimide layer, for example a polyetherimide dielectric layer, can have a dielectric strength of 80 to 150 KV/mm, or 90 to 120 KV/mm, or 100 to 110 KV/mm.

The polyetherimide layer, for example a polyetherimide dielectric layer, can have a breakdown voltage of 1 to 10 kV, or 3 to 8 kV, or 4 to 6 kV.

The polyetherimide layer, for example a polyetherimide dielectric layer, resists deformation as determined by IPC method TM-650 (2.6.27) when subjected to a lead-free solder reflow process at a temperature of greater than or equal to 260° C., preferably 260 to 350° C.

The polyetherimide layer, for example a polyetherimide dielectric layer, can have an average water absorption of 0.1 to 0.5%, preferably 0.1 to 0.3%.

A circuit assembly can have a peel strength of 1 to 3, or 1.3 to 1.8, as determined in accordance with IPC-TM-650 test methods.

The polyetherimide layer, for example a polyetherimide dielectric layer, can have a thermal conductivity of 2.5 to 5 W/mK, preferably 3 to 4.5 W/mK. Thermal conductivity can be determined by a variety of methods, for example EN 12667, ISO 22007-2:2008, or ASTM C518-10. In an embodiment ISO 22007-2:2008 is used.

A circuit assembly can further have the same adhesion, within +10%, as determined by IPC-TM-650 test methods, before and after thermal stress at 280° C. for 30 minutes in accordance with SJ 20780-2000. The circuit assembly further does not display "popcorning" after thermal stress at 280° C. for 30 minutes.

Articles comprising the circuit assemblies formed by circuitizing at least one of the conductive metal layers are another aspect of the disclosure. Articles include those comprising printed circuits as used in medical or aerospace industries. Still other articles include antennae and like articles. In other embodiments such articles include, but are not limited to, those comprising printed circuit boards, which are used, for example, in lighting, displays, cameras, audio and video equipment, personal computers, mobile telephones, electronic notepads, and like devices, or office automation equipment. In other embodiments electrical parts can be mounted on printed circuit boards comprising a laminate.

In some embodiments, the present disclosure provides a method of preparing a circuit material and circuit board that does not require a step of applying or curing an adhesive.

The polyetherimide-containing circuit boards provided are inexpensive, reliable, demonstrate good processability, and are compatible with materials and manufacturing processes in which circuit boards are used. The disclosed sandwich-type structure provides good heat dissipation and electric isolation of the printed circuit in the conductive metal layer. The circuit boards are furthermore suitable for non-flat PCB/lighting designs compared to conventional circuit boards. Therefore, a substantial improvement in printed circuit boards and their assembly is provided.

EXAMPLES

The materials shown in Table 1 were used in the following examples. The amount of each component in the following Tables is provided in terms of weight percent (wt. %), where the wt. % of each component is based on the total weight of the composition.

TABLE 1

| Component | Description | Supplier |
| --- | --- | --- |
| Polyetherimide sulfone (PEI-1) | Polyetherimide made from the reaction of bisphenol A dianhydride with 4,4'-diaminodiphenylsulfone, having a glass transition temperature of 267° C., available as EXTEM ™ XH1015-1000. | SABIC |
| Polyetherimide sulfone (PEI-2) | Polyetherimide made from the reaction of bisphenol A dianhydride with 4,4'-diaminodiphenylsulfone, having a glass transition temperature of 267° C. using a hexamethyl guanidinium chloride catalyst | SABIC |
| Boron Nitride (BN) | CAS No. 10043-11-5, Hexagonal boron nitride | Dandong Chemical Engineering Institute Co. |
| Graphite | CAS No. 7782-42-5, Graphite 1125 | Asbury Carbons |
| Polyether ether ketone (PEEK) | PEEK 450 G | Victrex |
| Polyphenylsulfone (PPSU) | Polyphenylsulfone, available as Radel R-5100, Mw about 51,500 g/mol by GPC (PS standards), having a glass transition temperature of 224° C. | Solvay Co. |

Sample Preparation

Compounding of the example compositions was carried out in a Werner & Pfleiderer twin screw extruder having a diameter of 40 mm and L/D ratio of 40:1. The temperature was 390° C. along the screw length, screw revolutions per minute (rpm) was 250, and feed rate was 32 kg/hour.

After compounding, specimens for tensile, flexural, impact, and HDT were injection molded using an Engel 110 T injection molding machine at 395° C.

Sample Testing

Physical measurements were made using the following tests and test methods, as described below.

Tensile properties were tested according to ASTM D638, and flexural properties were tested according to ASTM D790, both using a modified Instron 1125 testing machine.

Izod impact strength (notched and unnotched) was measured according to ASTM D256 using a Tinius Olsen 892 and 104 impact tester.

Heat deflection temperature (HDT) was evaluated flatwise in a Dynisco HDV3 instrument according to ASTM D648, using 120° C./hour temperature ramp and a load of 1.8 megaPascals (MPa).

Moisture absorption measurements were carried out according to ISO 62. Samples having dimensions of 60 millimeters (mm) by 60 mm were first kept at 50° C.±2° C. for 24 hours in a constant temperature chamber. The samples were cooled to 20° C.±10° C. and weighed. The samples were immersed in water at 23° C.±0.5° C. for 24 hours, then weighed again. The moisture absorption was calculated as a percent based on the difference between the two weights recorded.

Through-plane and in-plane thermal conductivity ("TC") were measured according to ISO 22007-2.

Surface resistivity of the compositions comprising graphite was measured according to ASTM D257-99.

For each example described below, the polyetherimide sulfone, the thermally conductive filler(s), and optionally the second thermoplastic polymer component were melt mixed in the amounts shown in the tables below. All components were melt-mixed, extruded, and tested as described above.

Examples 1-4

Compositions comprising polyetherimide sulfone and boron nitride were prepared and tested. Results of mechanical, impact, and thermal property testing are also shown in Table 2.

TABLE 2

|  |  | Unit | 1 | 2 | 3 | 4 |
|---|---|---|---|---|---|---|
| Component |  |  |  |  |  |  |
| PEI-1 |  | % | 65 | 55 |  |  |
| PEI-2 |  | % |  |  | 65 | 55 |
| BN |  | % | 35 | 45 | 35 | 45 |
| Properties |  |  |  |  |  |  |
| Specific Gravity |  | — | 1.52 | 1.592 | 1.515 | 1.601 |
| Modulus of Elasticity |  | MPa | 11740 | 15300 | 11680 | 15400 |
| Tensile Strength at Break |  | MPa | 70.2 | 65.9 | 68.6 | 58.6 |
| % Elongation at Break |  | % | 1.01 | 0.7 | 0.99 | 0.58 |
| Flexural Modulus |  | MPa | 10500 | 14200 | 11300 | 15300 |
| Flexural Stress at Break |  | MPa | 97.4 | 90.2 | 93.8 | 81.2 |
| Impact Strength (Notched) |  | J/m | 29.5 | 16.5 | 24.9 | 16.6 |
| Impact Strength (Unnotched) |  | J/m | 124 | 91.9 | 121 | 83.1 |
| HDT |  | ° C. | 252 | 253 | 248 | 249 |
| $T_g$ |  | ° C. | 262.3 | 262 | 260.2 | 258.3 |
| % moisture absorbed |  | % | 0.35 | 0.29 | 0.37 | 0.35 |
| Through-Plane TC |  | W/mK | 0.32 | 0.386 | 0.314 | 0.456 |
| In-Plane TC |  | W/mK | 3.222 | 5.443 | 3.197 | 5.493 |
| Heat Reflow (1 mm) | Dry | ° C. | >260 | >260 | >260 | >260 |
|  | 60° C., 60% | ° C. | 247 | 250 | 254 | 251 |
|  | 85° C., 85% | ° C. | 233 | 238 | 242 | 238 |
| Heat Reflow (2 mm) | Dry | ° C. | >260 | >260 | >260 | >260 |
|  | 60° C., 60% | ° C. | 243 | >260 | 249 | 249 |
|  | 85° C., 85% | ° C. | 236 | 235 | 247 | 245 |
| Heat Reflow (3 mm) | Dry | ° C. | >260 | >260 | >260 | >260 |
|  | 60° C., 60% | ° C. | 260 | 260 | 260 | 260 |
|  | 85° C., 85% | ° C. | 240 | 235 | 236 | 238 |

The data in Table 2 shows tensile strengths of 58.6 to 70.2 MPa and flexural moduli of 10,500 to 15,300 MPa. Flexural modulus was observed to be higher for the compositions of examples 2 and 4, comprising 45 wt. % boron nitride. Izod impact strength (notched and unnotched) was observed to be higher for example 1 and 3, comprising 65 wt. % of the polyetherimide sulfone. The compositions of examples 1-4 showed comparable HDT and Tg. The compositions had low moisture absorption, good thermal conductivity, and were able to withstand the lead-free solder reflow process. The compositions were subjected to the heat reflow process using both dry (unconditioned) samples, and samples that had been conditioned at 60° C. and 60% relative humidity, and at 85° C. and 85% relative humidity. Each of the unconditioned samples did not exhibit deformation or popcorning at 260° C. or above, whereas the conditioned samples resisted deformation up to 260° C.

Examples 5-8

Compositions comprising polyetherimide sulfone, boron nitride, and graphite were prepared and tested, as shown in Table 3. Results of mechanical, impact, and thermal property testing are also shown in Table 3.

TABLE 3

|  | Unit | 5 | 6 | 7 | 8 |
|---|---|---|---|---|---|
| Component |  |  |  |  |  |
| PEI-1 | % | 55 | 45 |  |  |
| PEI-2 | % |  |  | 55 | 45 |
| BN | % | 35 | 45 | 35 | 45 |
| Graphite | % | 10 | 10 | 10 | 10 |
| Properties |  |  |  |  |  |
| Specific Gravity | — | 1.6 | 1.677 | 1.604 | 1.685 |
| Modulus of Elasticity | MPa | 15640 | 17580 | 15920 | 18620 |
| Tensile Strength at Break | MPa | 63.6 | 59.2 | 67.1 | 59.9 |
| % Elongation at Break | % | 0.66 | 0.56 | 0.69 | 0.54 |
| Flexural Modulus | MPa | 14600 | 18700 | 15100 | 20000 |
| Flexural Stress at Break | MPa | 84.9 | 79.9 | 87.1 | 78.8 |
| Impact Strength (Notched) | J/m | 15.7 | 15.8 | 16.3 | 15.8 |
| Impact Strength (Unnotched) | J/m | 80.8 | 62.6 | 88.9 | 66.4 |
| HDT | ° C. | 252 | 255 | 253 | 241 |
| $T_g$ | ° C. | 288.3 | 261.8 | 258.8 | 251.6 |
| % Moisture absorbed | % | 0.26 | 0.2 | 0.26 | 0.29 |

TABLE 3-continued

|  | Unit | 5 | 6 | 7 | 8 |
|---|---|---|---|---|---|
| Surface Resistivity | Ohm/sq | 2.05E+14 | 1.4E+14 | 4.91E+13 | 3.42E+13 |
| Through-Plane TC | W/mK | 0.48 | 0.671 | 0.521 | 0.731 |
| In-Plane TC, Hotdisk | W/mK | 6.555 | 9.999 | 7.328 | 10.206 |
| Heat Reflow Dry | °C. | >260 | >260 | >260 | >260 |
| (1 mm) 60° C., 60% | °C. | >260 | 249 | >260 | >260 |
| Heat Reflow Dry | °C. | >260 | >260 | >260 | >260 |
| (2 mm) 60° C., 60% | °C. | >260 | 254 | >260 | >260 |

The results in Table 3 demonstrate the unexpected effect that specific properties of the compositions, for example, thermal conductivity, heat resistance and the moisture barrier, were improved by replacing 10 weight percent of the boron nitride with 10 weight percent graphite in the thermally conductive filler composition. For example, the thermal conductivity of examples 5 and 7 was improved compared to examples 2 and 4, not including graphite. The in-plane thermal conductivity of examples 5 and 7 was 6.555 and 7.328 W/mK, respectively, compared to 5.443 and 5.493 W/mK for examples 2 and 4, respectively. Additionally, the conditioned compositions of example 5 and 7 retained excellent heat resistance, resisting deformation to temperatures greater than 260° C., whereas conditioned compositions of examples 2 and 4 resisted deformation only up to 260° C., specifically, up to about 250° C. The compositions of examples 5 and 7 also showed less moisture absorption at only 0.26%, whereas the compositions of examples 2 and 4 absorbed up to 0.35% moisture. An unexpected beneficial effect was therefore observed when 10 weight percent of graphite was included in the thermally conductive filler composition.

The results in Table 3 further show that the compositions of examples 5-8 have comparable tensile strengths as for the compositions of examples 1-4, not comprising graphite. Flexural modulus, however, was increased by an average of about 31% for the compositions of example 5-8, including 10 wt. % graphite. Impact strength for examples 5-8 was decreased compared to examples 1-4. The compositions of examples 5-8 showed comparable HDT and Tg. The compositions had low moisture absorption, good thermal conductivity, and were able to withstand the lead-free solder reflow process, as discussed above. The compositions were subjected to the heat reflow process using both dry (unconditioned) samples, and samples that had been conditioned at 60° C. and 60% relative humidity. The unconditioned samples each resisted deformation and did not exhibit popcorning at 260° C. or above, whereas the conditioned samples resisted deformation up to 260° C. The compositions of examples 5-8 were further evaluated for surface resistivity. The surface resistivities were in the range of 3.42E+13 to 2.05E+14 Ohm/square (Ω/sq), which indicated these compositions were electrically insulative.

Examples 9-11

Compositions comprising polyetherimide sulfone, boron nitride, and polyether ether ketone (PEEK) were prepared and tested, as shown in Table 4. Results of mechanical, impact, and thermal property testing are also shown in Table 4.

TABLE 4

|  |  | Unit | 9 | 10 | 11 |
|---|---|---|---|---|---|
| Component | | | | | |
| PEI-2 | | % | 45.5 | 38.5 | 31.5 |
| PEEK | | % | 19.5 | 16.5 | 13.5 |
| BN | | % | 35 | 45 | 55 |
| Properties | | | | | |
| Specific Gravity | | — | 1.52 | 1.59 | 1.647 |
| Modulus of Elasticity | | MPa | 11980 | 15220 | 17760 |
| Tensile Strength at Break | | MPa | 69.9 | 69.8 | 61.4 |
| % Elongation at Break | | % | 1.19 | 0.86 | 0.57 |
| Flexural Modulus | | MPa | 10900 | 14200 | 33700 |
| Flexural Stress at Break | | MPa | 90.4 | 83.3 | 75.2 |
| Impact Strength (Notched) | | J/m | 26.6 | 22 | 16 |
| Impact Strength (Unnotched) | | J/m | 155 | 114 | 71 |
| HDT | | °C. | 233 | 239 | 231 |
| $T_g$ | | °C. | 153.4, 252.6 | 154.7, 255.2 | 163, 232 |
| % Moisture absorbed | | % | 0.21 | 0.17 | 0.14 |
| Through-Plane TC | | W/mK | 0.348 | 0.457 | — |
| In-Plane TC | | W/mK | 3.401 | 5.444 | — |
| Heat Reflow (1 mm) | Dry | °C. | >260 | >260 | >260 |
|  | 60° C., 60% | °C. | 242 | 239 | 257 |
|  | 85° C., 85% | °C. | 234 | 250 | 245 |
| Heat Reflow (2 mm) | Dry | °C. | >260 | >260 | >260 |
|  | 60° C., 60% | °C. | 248 | 253 | 258 |
|  | 85° C., 85% | °C. | 241 | 249 | 252 |
| Heat Reflow (3 mm) | Dry | °C. | >260 | >260 | — |
|  | 60° C., 60% | °C. | 260 | 260 | — |
|  | 85° C., 85% | °C. | 240 | 243 | — |

The data in Table 4 shows that the compositions of example 9-11 comprising polyetherimide sulfone, polyether ether ketone (PEEK), and boron nitride have comparable tensile strength and flexural modulus as the compositions of examples 1-8. The composition of example 11 showed the highest flexural modulus of 33,700 MPa. The compositions of examples 9-11 also showed two glass transition temperatures (Tg) due to the presence of the second polymer component (PEEK). The compositions displayed low water absorption of 0.14-0.21%. Examples 9 and 10 showed good thermal conductivity and were able to pass the lead-free solder reflow test. The compositions were subjected to the heat reflow process using both dry (unconditioned) samples, and that had been conditioned at 60° C. and 60% relative humidity. The unconditioned samples of examples 9-11 passed the heat reflow test (e.g. did not exhibit deformation or popcorning at 260° C. or greater) at 1 and 2 millimeters, and the unconditioned samples of examples 9 and 10 further did not exhibit deformation or popcorning at 260° C. or greater at 3 mm. The conditioned samples of examples 9 and 10 resisted deformation up to 239-260° C.

Examples 12-14

Compositions comprising polyetherimide sulfone, boron nitride, and polyphenylsulfone (PPSU) were prepared and tested, as shown in Table 5. Results of mechanical, impact, and thermal property testing are also shown in Table 5.

TABLE 5

|  | Unit | 12 | 13 | 14 |
|---|---|---|---|---|
| Component |  |  |  |  |
| PEI-2 | % | 52 | 45.5 | 39 |
| PPSU | % | 13 | 19.5 | 26 |
| BN | % | 35 | 35 | 35 |
| Properties |  |  |  |  |
| Specific Gravity | — | 1.522 | 1.524 | 1.52 |
| Modulus of Elasticity | MPa | 11420 | 11400 | 11120 |
| Tensile Strength at Break | MPa | 67.5 | 66.6 | 65.5 |
| % Elongation at Break | % | 1.1 | 1.09 | 1.09 |
| Flexural Modulus | MPa | 20400 | 10800 | 10500 |
| Flexural Stress at Break | MPa | 86.8 | 85.9 | 85.9 |
| Impact Strength (Notched) | J/m | 25.5 | 24.6 | 26.3 |
| Impact Strength (Unnotched) | J/m | 141 | 173 | 156 |
| HDT | °C. | 241 | 238 | 235 |
| $T_g$ | °C. | 253.9 | 247.6 | 245.6 |
| % Moisture absorbed | % | 0.29 | 0.27 | 0.26 |
| Through-Plane TC | W/mK | 0.343 | 0.362 | 0.379 |
| In-Plane TC | W/mK | 3.403 | 3.478 | 3.408 |
| Heat Reflow (1 mm) Dry | °C. | >260 | >260 | >260 |
| 60° C., 60% | °C. | 249 | 245 | 250 |
| 85° C., 85% | °C. | 241 | 238 | 243 |
| Heat Reflow (2 mm) Dry | °C. | >260 | >260 | >260 |
| 60° C., 60% | °C. | 257 | 253 | 245 |
| 85° C., 85% | °C. | 246 | 245 | 241 |
| Heat Reflow (3 mm) Dry | °C. | >260 | >260 | >260 |
| 60° C., 60% | °C. | 258 | 257 | 260 |
| 85° C., 85% | °C. | 236 | 240 | 236 |

The data in Table 5 shows that the compositions of examples 12-14 comprising polyetherimide sulfone, PPSU, and boron nitride have comparable tensile strengths. Example 12, having the lowest incorporation of PPSU (13 wt. %), showed the highest flexural modulus of 20,400 MPa. Example 12 also recorded the highest glass transition temperature and HDT of examples 12-14. The compositions displayed low water absorption of 0.26-0.29%. Examples 12-14 showed good thermal conductivity and were able to pass the lead-free solder reflow test. The compositions were subjected to the heat reflow process using both dry (unconditioned) samples, and that had been conditioned at 60° C. and 60% relative humidity. The unconditioned samples each did not exhibit deformation or popcorning at 260° C. or greater. The conditioned sample of example 12 was observed to resist deformation up to 258° C. The conditioned sample of example 13 was observed to resist deformation up to 257° C. The conditioned sample of example 14 was observed to resist deformation up to 260° C.

The polyetherimide compositions, circuit assemblies, and methods are further illustrated by the following embodiments, which are non-limiting.

Embodiment 1

A polyetherimide composition comprising, a polyetherimide sulfone having a glass transition temperature of 240 to 320° C., preferably 245 to 312° C.; and a particulate, thermally conductive filler composition, wherein a layer comprising the polyetherimide composition resists deformation as determined by IPC method TM-650 when subjected to a lead-free solder reflow process at a temperature of greater than or equal to 260° C., preferably 260 to 350° C.; and a layer comprising the polyetherimide composition has a thermal conductivity of 2.5 to 15 W/mK, preferably 3 to 12 W/mK, as determined in accordance with ISO 22007-2: 2008.

Embodiment 2

The polyetherimide composition of embodiment 1, wherein a layer comprising the polyetherimide composition has an average water absorption of 0.1 to 0.5%, preferably 0.1 to 0.0.3%.

Embodiment 3

The polyetherimide composition of any one or more of embodiments 1 to 2, wherein the polyetherimide composition has a glass transition temperature of greater than or equal to 250° C., preferably 250 to 270° C., more preferably 260 to 270° C.

Embodiment 4

The polyetherimide composition of any one or more of embodiments 1 to 3, wherein the surface resistivity is greater than or equal to $1\times10^{13}$ ohm/sq.

Embodiment 5

The polyetherimide composition of any one or more of embodiments 1 to 4, comprising 40 to 90 wt. %, preferably 40 to 70 wt. % of the polyetherimide sulfone; and 10 to 60 wt. %, preferably 30 to 60 wt. % of the particulate, thermally conductive filler composition, wherein weight percent is based on the total weight of the polyetherimide composition.

Embodiment 6

The polyetherimide composition of any one or more of embodiments 1 to 5, wherein the polyetherimide sulfone comprises units of the formula

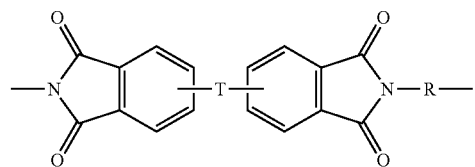

wherein R is a $C_{2-20}$ hydrocarbon group, wherein at least 10 mol % of the R groups comprise a sulfone group, T is —O— or a group of the formula —O—Z—O— wherein the divalent bonds of the —O— or the —O—Z—O— group are in the 3,3', 3,4', 4,3', or the 4,4' positions, and Z is an aromatic $C_{6-24}$ monocyclic or polycyclic group optionally substituted with 1 to 6 $C_{1-8}$ alkyl groups, 1-8 halogen atoms, or a combination comprising at least one of the foregoing.

Embodiment 7

The polyetherimide composition of embodiment 6, wherein R is a divalent group of the formula

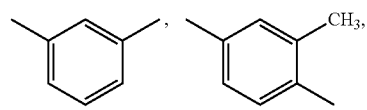

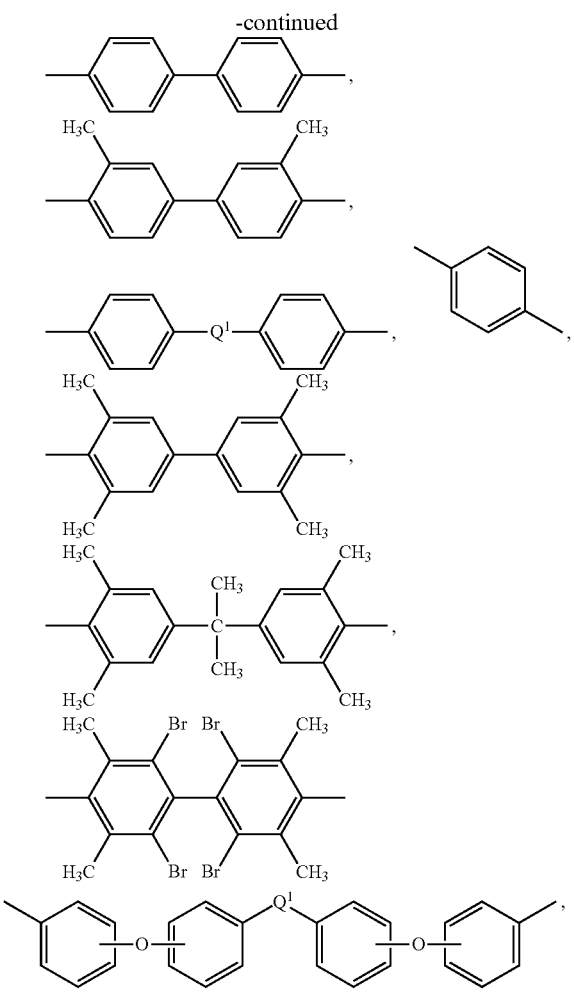

wherein $Q^1$ is —O—, —S—, —C(O)—, —SO$_2$—, —SO—, —C$_y$H$_{2y}$— and a halogenated derivative thereof wherein y is an integer from 1 to 5, or —(C$_6$H$_{10}$)$_z$— wherein z is an integer from 1 to 4; and Z is a group derived from a dihydroxy compound of the formula

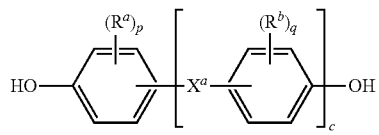

wherein R$^a$ and R$^b$ are each independently a halogen atom or a monovalent C$_{1-6}$ alkyl group; p and q are each independently integers of 0 to 4; c is 0 to 4; and X$^a$ is a single bond, —O—, —S—, —S(O)—, —SO$_2$—, —C(O)—, or a C$_{1-18}$ organic bridging group.

Embodiment 8

The polyetherimide composition of embodiment 6 or 7, wherein at least 10 mol % of the R groups is a diphenylenesulfone and Z is bis(4,4'-phenylene) isopropylidene.

Embodiment 9

The polyetherimide composition of any one or more of embodiments 1 to 8, wherein the thermally conductive filler composition comprises boron nitride, graphite, aluminum nitride, silicon nitride, MgSiN$_2$, silicon carbide, particles coated with one or more of the foregoing, zinc sulfide, calcium oxide, magnesium oxide, zinc oxide, titanium oxide, or a combination comprising at least one of the foregoing thermally conductive fillers.

Embodiment 10

The polyetherimide composition of any one or more of embodiments 1 to 9, wherein the thermally conductive filler composition comprises boron nitride, graphite, or a combination comprising at least one of the foregoing.

Embodiment 11

The polyetherimide composition of any one or more of embodiments 1 to 10, wherein the thermally conductive filler composition comprises 30 to 50 wt. % boron nitride, based on the total weight of the polyetherimide composition.

Embodiment 12

The polyetherimide composition of any one or more of embodiments 1 to 11, wherein the thermally conductive filler composition comprises 30 to 50 wt. % boron nitride; and 5 to 15 wt. % graphite, wherein weight percent is based on the total weight of the polyetherimide composition.

Embodiment 13

A polyetherimide composition comprising, a polyetherimide sulfone having a glass transition temperature of 240 to 320° C., preferably 245 to 312° C.; an additional polymer different from the polyetherimide sulfone having a glass transition temperature greater than 140° C.; and a particulate, thermally conductive filler composition wherein a layer comprising the polyetherimide composition resists deformation as determined by IPC method TM-650 when subjected to a lead-free solder reflow process at a temperature of greater than or equal to 260° C., preferably 260 to 350° C.; and a layer comprising the polyetherimide composition has a thermal conductivity of 3 to 6 W/mK, preferably 3 to 5.5 W/mK, as determined in accordance with ISO 22007-2: 2008.

Embodiment 14

The polyetherimide composition of embodiment 13, wherein a layer comprising the polyetherimide composition has an average water absorption of 0.1 to 0.5%, preferably 0.1 to 0.3%.

Embodiment 15

The polyetherimide composition of any one or more of embodiments 13 to 14, wherein the polyetherimide composition has at least one glass transition temperature of greater than or equal to 230° C., preferably 230 to 270° C., more preferably 250 to 270° C.

Embodiment 16

The polyetherimide composition of any one or more of embodiments 13 to 15, comprising 30 to 70 wt. %, preferably 30 to 60 wt. % of the polyetherimide sulfone; and 1 to 35 wt. %, preferably 10 to 30 wt. %, of the additional polymer different from the polyetherimide sulfone, wherein weight percent is based on the total weight of the polyetherimide composition.

Embodiment 17

The polyetherimide composition of any one or more of embodiments 13 to 16, wherein the polyetherimide sulfone comprises units of the formula

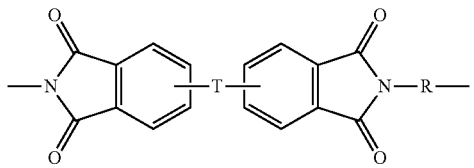

wherein R is a $C_{2-20}$ hydrocarbon group, wherein at least 10 mol % of the R groups comprise a sulfone group, T is —O— or a group of the formula —O—Z—O— wherein the divalent bonds of the —O— or the —O—Z—O— group are in the 3,3', 3,4', 4,3', or the 4,4' positions, and Z is an aromatic $C_{6-24}$ monocyclic or polycyclic group optionally substituted with 1 to 6 $C_{1-8}$ alkyl groups, 1-8 halogen atoms, or a combination comprising at least one of the foregoing.

Embodiment 18

The polyetherimide composition of embodiment 17, wherein R is a divalent group of the formula

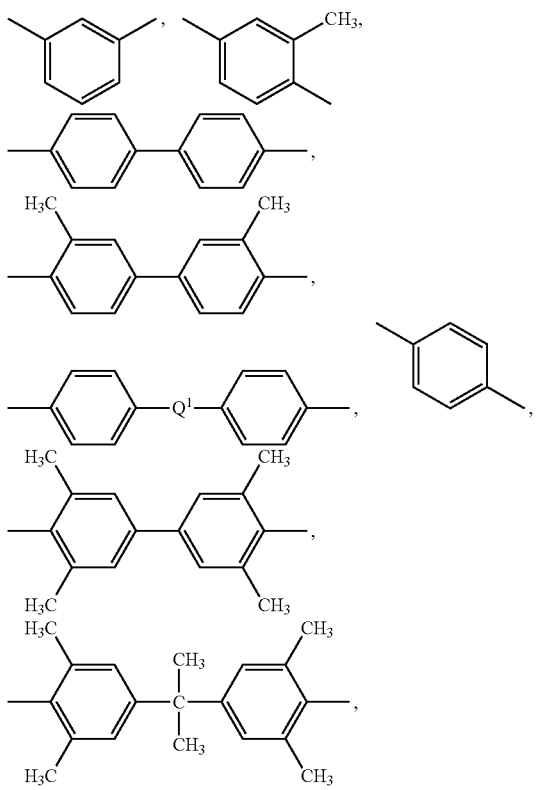

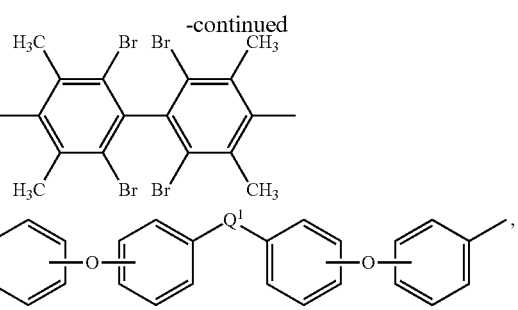

wherein $Q^1$ is —O—, —S—, —C(O)—, —SO$_2$—, —SO—, —C$_y$H$_{2y}$— and a halogenated derivative thereof wherein y is an integer from 1 to 5, or —(C$_6$H$_{10}$)$_z$— wherein z is an integer from 1 to 4; and Z is a group derived from a dihydroxy compound of the formula

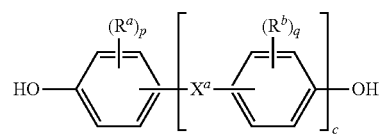

wherein $R^a$ and $R^b$ are each independently a halogen atom or a monovalent $C_{1-6}$ alkyl group; p and q are each independently integers of 0 to 4; c is 0 to 4; and $X^a$ is a single bond, —O—, —S—, —S(O)—, —SO$_2$—, —C(O)—, or a $C_{1-18}$ organic bridging group.

Embodiment 19

The polyetherimide composition of embodiment 17 or 18, wherein at least 10 mol % of the R groups is a diphenylene sulfone and Z is bis(4,4'-phenylene)isopropylidene.

Embodiment 20

The polyetherimide composition of any one or more of embodiments 13 to 19, wherein the thermally conductive filler composition comprises boron nitride, graphite, aluminum nitride, silicon nitride, MgSiN$_2$, silicon carbide, particles coated with one or more of the foregoing, zinc sulfide, calcium oxide, magnesium oxide, zinc oxide, titanium oxide, or a combination comprising at least one of the foregoing thermally conductive fillers.

Embodiment 21

The polyetherimide composition of any one or more of embodiments 13 to 20, wherein the thermally conductive filler composition comprises boron nitride, graphite, or a combination comprising at least one of the foregoing.

Embodiment 22

The polyetherimide composition of any one or more of embodiments 13 to 21, wherein the thermally conductive filler composition comprises 30 to 60 wt. % boron nitride, based on the total weight of the polyetherimide composition.

Embodiment 23

The polyetherimide composition of embodiment 22, wherein the thermally conductive filler composition further comprises 1 to 15 wt. % graphite, wherein weight percent is based on the total weight of the polyetherimide composition.

Embodiment 24

The polyetherimide composition of any one or more of embodiments 13 to 23, wherein the additional polymer comprises a polyphenylsulfone, a polyether sulfone, a polysulfone, a polyphenylene sulfone, a polyphenylene sulfide, a polyetherketone, a polyetheretherketone, a polyketone, a polyphthalamide, an aromatic polyimide, an aromatic polyetherimide, polyaryletherketones, or a combination comprising at least one of the foregoing additional polymers.

Embodiment 25

The polyetherimide composition of any one or more of embodiments 13 to 24, wherein the additional polymer comprises a polyphenylsulfone, a polyetheretherketone, or a combination comprising at least one of the foregoing.

Embodiment 26

A circuit assembly comprising a polyetherimide dielectric layer comprising the polyetherimide composition of any one or more of embodiments 1 to 25; and a conductive metal layer disposed on the polyetherimide dielectric layer; wherein the polyetherimide dielectric layer resists deformation as determined by IPC method TM-650 when subjected to a lead-free solder reflow process at a temperature of greater than or equal to 260° C., preferably 260 to 350° C., and the polyetherimide dielectric layer has a thermal conductivity of 2.5 to 15 W/mK, preferably 3 to 12 W/mK, as determined in accordance with ISO 22007-2:2008.

Embodiment 27

The circuit assembly of embodiment 26, wherein the conductive metal layer is in the form of a circuit.

Embodiment 28

An article comprising the circuit assembly of any one or more of embodiments 26 to 27.

Embodiment 29

A method of preparing the circuit assembly of any one or more of embodiments 26 to 27, the method comprising forming the polyetherimide dielectric layer; laminating the polyetherimide dielectric layer to the conductive metal layer under heat and pressure; and reflow-soldering an electronic component to the circuit assembly.

Embodiment 30

The method of embodiment 29, wherein the forming comprises extruding the polyetherimide dielectric layer, three-dimensionally printing the polyetherimide dielectric layer, metal insert molding the polyetherimide dielectric layer, or multilayer film casting the polyetherimide dielectric layer.

Embodiment 31

A method of preparing the circuit assembly of any one or more of embodiments 26 to 27, the method comprising extruding the polyetherimide dielectric layer; laminating the polyetherimide dielectric layer to the conductive metal layer under heat and pressure; and reflow-soldering an electronic component to the circuit assembly.

In general, the compositions and circuit assemblies can alternatively comprise, consist of, or consist essentially of, any appropriate components herein disclosed. The compositions or circuit assemblies can additionally, or alternatively, be formulated so as to be devoid, or substantially free, of any components, materials, ingredients, adjuvants or species used in the prior art compositions or that are otherwise not necessary to the achievement of the function and/or objectives of the present embodiments.

All ranges disclosed herein are inclusive of the endpoints, and the endpoints are independently combinable with each other. "Combination" is inclusive of blends, mixtures, alloys, reaction products, and the like. Furthermore, the terms "first," "second," and the like, herein do not denote any order, quantity, or importance, but rather are used to denote one element from another. The terms "a" and "an" and "the" herein do not denote a limitation of quantity, and are to be construed to cover both the singular and the plural, unless otherwise indicated herein or clearly contradicted by context. "Or" means "and/or".

The term "alkyl" means branched or straight chain, unsaturated aliphatic $C_{1-30}$ hydrocarbon groups e.g., methyl, ethyl, n-propyl, i-propyl, n-butyl, s-butyl, t-butyl, n-pentyl, s-pentyl, n- and s-hexyl, n- and s-heptyl, and, n- and s-octyl. "Alkenyl" means a straight or branched chain, monovalent hydrocarbon group having at least one carbon-carbon double bond (e.g., ethenyl (—HC=CH$_2$)). "Alkoxy" means an alkyl group that is linked via an oxygen (i.e., alkyl-O—), for example methoxy, ethoxy, and sec-butyloxy groups. "Alkylene" means a straight or branched chain, saturated, divalent aliphatic hydrocarbon group (e.g., methylene (—CH$_2$—) or, propylene (—(CH$_2$)$_3$—)). "Cycloalkylene" means a divalent cyclic alkylene group, —C$_n$H$_{2n-x}$, wherein x represents the number of hydrogens replaced by cyclization(s). "Cycloalkenyl" means a monovalent group having one or more rings and one or more carbon-carbon double bonds in the ring, wherein all ring members are carbon (e.g., cyclopentyl and cyclohexyl). "Aryl" means an aromatic hydrocarbon group containing the specified number of carbon atoms, such as to phenyl, tropone, indanyl, or naphthyl. The prefix "halo" means a group or compound including one more of a fluoro, chloro, bromo, iodo, and astatino substituent. A combination of different halo groups (e.g., bromo and fluoro) can be present. In an embodiment only chloro groups are present. The prefix "hetero" means that the compound or group includes at least one ring member that is a heteroatom (e.g., 1, 2, or 3 heteroatom(s)), wherein the heteroatom(s) is each independently N, O, S, or P.

"Substituted" means that the compound or group is substituted with at least one (e.g., 1, 2, 3, or 4) substituents independently selected from a $C_{1-9}$ alkoxy, a $C_{1-9}$ haloalkoxy, a nitro (—NO$_2$), a cyano (—CN), a $C_{1-6}$ alkyl sulfonyl (—S(=O)$_2$-alkyl), a $C_{6-12}$ aryl sulfonyl (—S(=O)$_2$-aryl)a thiol (—SH), a thiocyano (—SCN), a tosyl (CH$_3$C$_6$H$_4$SO$_2$—), a $C_{3-12}$ cycloalkyl, a $C_{2-12}$ alkenyl, a $C_{5-12}$ cycloalkenyl, a $C_{6-12}$ aryl, a $C_{7-13}$ arylalkylene, a $C_{4-12}$ heterocycloalkyl, and a $C_{3-12}$ heteroaryl instead of hydrogen, provided that the substituted atom's normal valence is not exceeded, and the substituent does not significantly adversely affect the desired properties of the compound.

While particular embodiments have been described, alternatives, modifications, variations, improvements, and substantial equivalents that are or can be presently unforeseen can arise to applicants or others skilled in the art. Accordingly, the appended claims as filed and as they can be amended are intended to embrace all such alternatives, modifications variations, improvements, and substantial equivalents.

We claim:

1. A circuit assembly comprising
a polyetherimide dielectric layer comprising a polyetherimide composition comprising
a polyetherimide sulfone having a glass transition temperature of 240 to 320° C.; and
a particulate, thermally conductive filler composition comprising 30 to 50 wt. % boron nitride and 5 to 15 wt. % graphite, wherein weight percent is based on the total weight of the polyetherimide composition; and
a conductive metal layer disposed on the polyetherimide dielectric layer;
wherein the polyetherimide dielectric layer
resists deformation as determined by IPC method TM-650 when subjected to a lead-free solder reflow process at a temperature of greater than or equal to 260° C., and the polyetherimide dielectric layer has a thermal conductivity of 2.5 to 15 W/mK as determined in accordance with ISO 22007-2:2008.

2. The circuit assembly of claim 1, wherein the conductive metal layer is in the form of a circuit.

3. An article comprising the circuit assembly of claim 1.

4. A method of preparing the circuit assembly of claim 1, the method comprising
forming the polyetherimide dielectric layer;
laminating the polyetherimide dielectric layer to the conductive metal layer under heat and pressure; and
reflow-soldering an electronic component to the circuit assembly.

5. The method of claim 4, wherein the forming comprises extruding the polyetherimide dielectric layer, three-dimensionally printing the polyetherimide dielectric layer, metal insert molding the polyetherimide dielectric layer, or multilayer film casting the polyetherimide dielectric layer.

* * * * *